# United States Patent [19]

Zabel et al.

[11] Patent Number: 5,868,297
[45] Date of Patent: Feb. 9, 1999

[54] DEVICE FOR SEPARATING COMPONENTS FROM A SUBSTRATE, IN PARTICULAR FOR UNSOLDERING ELECTRONIC COMPONENTS

[75] Inventors: Claus Zabel, Augsburg; Helmut W. Leicht, Königsbrunn, both of Germany

[73] Assignee: IBL Lottechnik, Germany

[21] Appl. No.: 860,260

[22] PCT Filed: Mar. 25, 1996

[86] PCT No.: PCT/EP96/01311

§ 371 Date: Nov. 10, 1997

§ 102(e) Date: Nov. 10, 1997

[87] PCT Pub. No.: WO96/31109

PCT Pub. Date: Oct. 3, 1996

[30] Foreign Application Priority Data

Mar. 24, 1995 [DE] Germany ................... 195 10 985.6

[51] Int. Cl.[6] ................................................. B23K 3/00
[52] U.S. Cl. ........................................ 228/19; 228/264
[58] Field of Search ............................. 228/14, 13, 264, 228/119, 191

[56] References Cited

U.S. PATENT DOCUMENTS 5,553,766  9/1996  Jackson et al. ........................ 228/13
5,556,024  9/1996  Olson et al. ........................... 228/264
5,702,051  12/1997  Leicht ................................... 228/264

FOREIGN PATENT DOCUMENTS

| 0079848 | 5/1983 | European Pat. Off. ....... H05K 13/04 |
| 1943393 | 3/1971 | Germany .................... 21/20 |
| 4211241 | 12/1995 | Germany ................. H05K 3/34 |
| 9100768 | 12/1992 | Netherlands ............. H05K 3/34 |

*Primary Examiner*—Samuel M. Heinrich
*Attorney, Agent, or Firm*—George W. Rauchfuss, Jr.

[57] ABSTRACT

Disclosed is a device for separating components (3, 20), in particular electronic components which are connected to a support such as a circuit board (1) by a fixing material such as solder and can be lifted from the support with the aid of a gripping element (17) under a preloaded force acting in the direction in which the components (3, 20) are to be lifted from the support. A lifting device (13) connected to the gripping element (17) causes the preloaded force to become effective when the fixing material reaches its melting temperature. The lifting device (17) is provided with a retaining member (9, 25, 31, 33) whose melting temperature is equal to or higher than that of the fixing material and which triggers the action of lifting the component (3, 20) when the fusible material melts.

11 Claims, 4 Drawing Sheets

Fig. 6 a
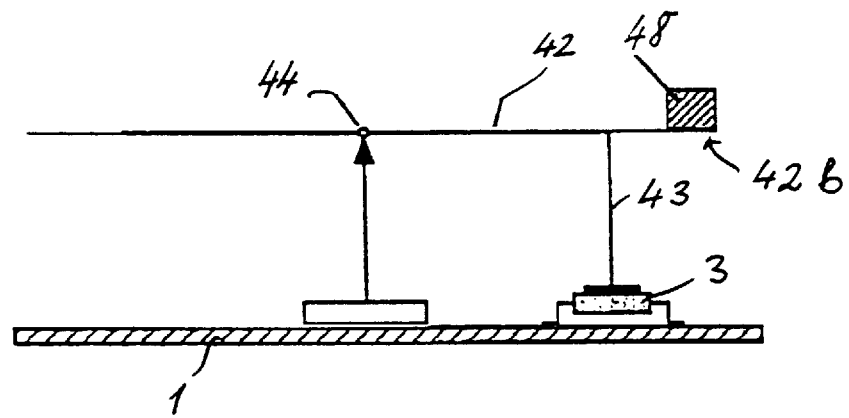
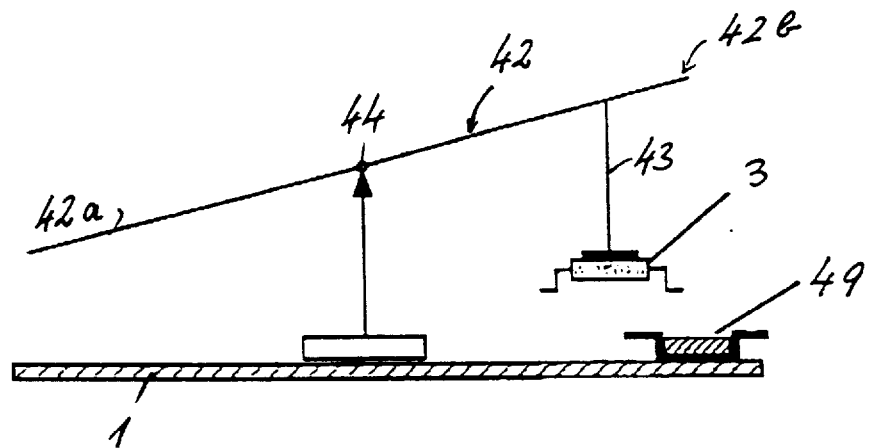
Fig. 6 b

DEVICE FOR SEPARATING COMPONENTS FROM A SUBSTRATE, IN PARTICULAR FOR UNSOLDERING ELECTRONIC COMPONENTS

The invention relates to a device for separating components connected to a substrate by a fusible or meltable material from said substrate and, in particular, for unsoldering components, in particular electronic components connected to a support, in particular a circuit board, by a solder. The device lifts the components from the support by means of a gripping element under a preloaded force acting in the direction in which the components are to be lifted from the support, wherein a lifting device connected to the gripping element causes the preloaded force to become effective when the fixing material reaches its melting temperature.

A device of this kind is described in DE-A-42 11 241. In this device, a gripping element or a bonding device is used as the lifting device being preloaded by a spring or another elastic means. The spring exerts a tensile force on the component to be unsoldered causing the respective component to be lifted when the soldering joints by means of which the component is connected to the circuit board have been caused to melt. Until that point of time the entire force of the spring acts on that component whose soldered terminals are subject to a respective load, thus possibly causing these soldering joints to rupture before their solder melts and leading to a destruction in the component and the circuit board.

It is an object of the invention to overcome this risk. According to the invention, this is achieved by providing the lifting device with a retaining member consisting of a meltable material, e.g. a fusion adhesive or a metal alloy similar to a solder, the melting temperature of which is equal to or higher than the melting temperature of the fusible material or the solder, and which triggers the action of lifting the component when the material or metal alloy melts.

Although in the following the invention is described in particular on the basis of a device for unsoldering components connected to a support by means of a metal alloy similar to a solder, the principle according to the invention can be used in all those cases in which the fixing material, such as an adhesive, has a specific melting temperature and a respective material having an essentially equal or higher melting temperature is used for the retaining member.

If a metal alloy similar to a solder is used as the retaining member, its melting temperature can easily be adapted to the melting temperature of the solder so that when the solder melts and releases the respective component immediately also the retaining member is caused to melt and thus triggers the lifting of the component. The preloaded force acting on the lifting device, which triggers a movement of the lifting device upon melting of the retaining element, thus becomes effective only after the solder melts so that the preloaded force can only have an effect on the component when it had already been released from the support due to the melting of the solder. Therefore, when the component is still connected to the support by the solid solder, the preloaded force does not act on the component. If a metal alloy similar to a solder which has a melting temperature equal to the melting temperature of the solder is used for the retaining element, e.g. when the same material composition is used, first also the solder melts and then the retaining element melts since the heating up necessary for the unsoldering process becomes first effective on the soldering joints of the components and, with a slight delay, in the same way on the retaining element since, due to its connection to the lifting device, it is surrounded by components which first cause a certain heat absorption. If the melting temperature of the metal alloy similar to a solder is higher than that of the solder, when heat is applied for unsoldering the components the solder melts automatically first and only then the retaining element melts if, of course, the application of heat for the unsoldering process takes place such that in the area of the components and the lifting device a temperature is reached which is higher than the melting temperature of the solder and at least equal to the melting temperature of the retaining element. This is for example the case when a vapor phase is used for the unsoldering process as described in the above-mentioned DE-A-42 11 241.

In case the melting temperature of the metal alloy similar to a solder is higher than the melting temperature of the solder, it is appropriate to select the first melting temperature only slightly higher in order to prevent the components from being heated too much. Advantageously, the melting temperature of the metal alloy similar to a solder is a few degrees Celsius higher than the melting temperature of the solder.

There are different possibilities of how to form the retaining element. An advantageous possibility is to form the retaining element as a supporting member for the lifting device. In this case the lifting device is held by the supporting member and can thus not exert a tensile force on the component until the retaining member has reached its melting temperature. When this melting temperature is reached, the supporting member loses its effect so that the lifting device can lift the component from the support. The supporting member is advantageously arranged in an open container from which it can easily be taken out after melting and thus becoming a metal alloy part being ineffective in this connection. This metal alloy part can either be thrown away or can be used again by remelting. For unsoldering a further component, however, a non-deformed supporting element must be introduced into the container as the retaining element.

The retaining element can also be formed as a thread clamped between the lifting device and a holding means. In this case, the thread holds the lifting device against the preloaded force until the thread melts; subsequently, the lifting device can lift the component from the support.

A further possibility for forming the retaining element is to form it as a block into which a tension rod linked with the lifting device immerses. For connecting the block to the tension rod, the metal alloy similar to a solder is first melted open and the tension rod is immersed into the melt. Then the melt is allowed to cool to form the block which then holds the immersed tension rod and thus blocks the lifting device until the block melts. The tension rod can be pulled out of the molten block by the preloaded force by means of the movement of the lifting device, and the respective component is thus lifted.

A further possibility for forming the retaining element is to use it like a shearing pin. The shearing pin, a known component, acts by being pushed through truly-aligned holes of two components which are moved one past the other and thereby preventing the movement of the components. Only when a force causing the shearing of the shearing pin is acting on the components can the components be displaced against each other. In case it is used as a retaining element, this means that it is pushed into truly-aligned holes of two components which are moved one past the other, whilst, however, no shearing of the pin takes place, but the movability of the components is achieved when the pin is caused to melt. The components are on the one hand a part of the lifting device and, on the other hand, a somehow rigidly connected part.

The molten material or the metal alloy similar to a solder of the retaining member can advantageously shift during melting, e.g. flow away, so that by utilizing the gravitational force the lifting means moves such that the component is lifted from the support.

Springs causing the lifting movement need not be used in this case. However, within the invention it is also possible to additionally use such springs in support of the gravitational force.

The lifting device is advantageously formed as a lever on which the preloaded force is acting and the one end of which is connected to the gripper spacedly linked with the retaining member. The lever can either be a single or double lever.

The exemplifying embodiments of the invention are disclosed in the Figures in which FIG. 1 shows the device with a double lever and a retaining element formed as a supporting means in the position before lifting the component;

FIG. 6 shows a device with flowing-off molten material; and

Figure 1:
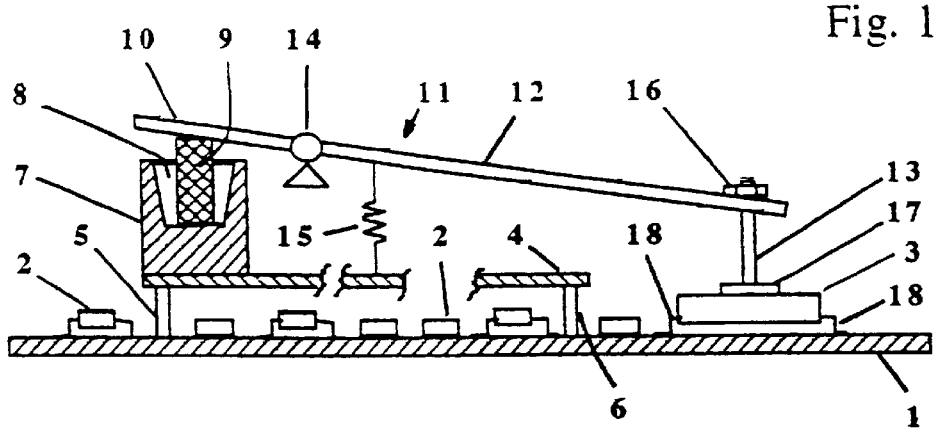

FIG. 1 shows a circuit board 1 with components 2 and 3 soldered thereto, wherein the components 2 and 3 are components which can in any known manner be soldered to a circuit board, e.g. resistors, transistors, integrated circuits or chips, etc. Component 3 is a larger component which can, e.g., be formed by an integrated circuit. As apparent, components 2 and 3 are connected to the circuit board 1 either planely or via terminals extending therefrom.

The frame 4 is placed on the circuit board 1 by means of its posts 5 and 6 such that the posts 5 and 6 directly contact free areas of the circuit board 1. The frame 4 carries the container 7 having a hollow space 8 enlarging conically towards the outside in which the retaining member 9 is introduced. This retaining member supports the lever arm 10 of the double lever 11 which also comprises the second arm 12 hinged to the lifting device 13. The double lever 11 is arranged on the swiveling axis 14 which can be arranged stationarily in any desired way, as shown in FIG. 1. However, it is of course possible to provide the swiveling axis 14 on the frame 4. The pressure spring 15 is acting on the lever arm 12, the one end of the pressure spring being supported by the frame 4 and the other end by the lever arm 12 thus providing the double lever 11 with a preloaded force by means of which the lever arm 12 with the lifting device 13 is preloaded in the lifting direction indicated by the arrow next to the lifting device 13. The lifting device 13 is secured by the disc 16 provided thereon against the lever arm 12 such that the lifting device 13 can be swiveled to a certain extent with respect to the lever arm 12. The lifting plate 17 to which, in this case, the component 3 is fixed, is provided on that end of the lifting device 13 facing away from the disc 16. The lifting plate 17 thus acts as the gripper of a lifting device formed by the double lever 11. Of course, also further known embodiments can be used for forming this gripper, e.g. a magnet, a suction plate or also a gripper formed as tongs, etc.

In this case, the retaining member 9 is formed as a rod consisting of a metal alloy similar to a solder, the melting temperature of which being somewhat higher than the melting temperature of the solder (e.g. 190° and 185°), by means of which the components 2, 3 are soldered to the circuit board 1 in a known manner. In the position shown in FIG. 1 the retaining member 9 receives the force of the pressure spring 15 so that the lifting device 13 cannot exert a tensile force on the component 3, i.e. the terminals 18 of the component 3 are not subject to a tensile load.

Figure 2:
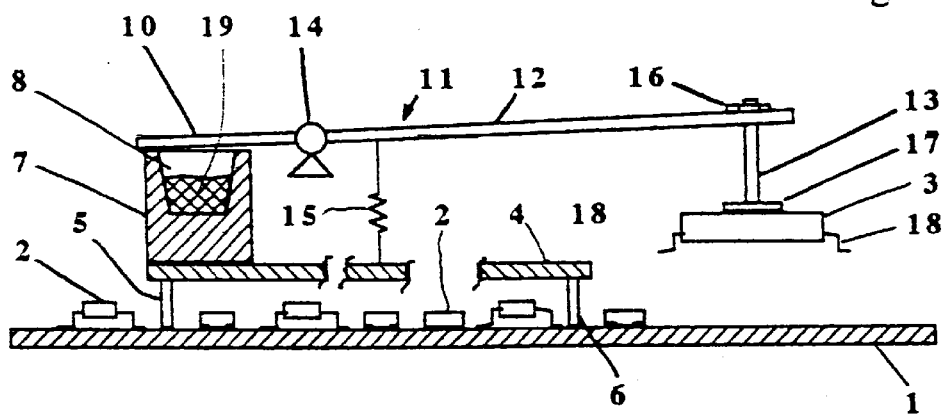
FIG. 2 shows the same device with a molten supporting member and a lifted component.

In order to unsolder the component 3, the arrangement shown in FIG. 1 is heated, i.e. in a vapor phase whose temperature is higher than the melting temperature of the solder connecting the terminals 18 to the circuit board 1 and that of the retaining element 9. Due to the heating the solder holding the terminals 18 melts first thereby releasing the component 3 from the circuit board 1. Upon heating up of the entire arrangement, also the retaining element 9 melts and thus collapses, and the molten material is collected in the container 7, as shown in FIG. 2. In this process, the retaining element 9 collapses thus causing the compressive force of the pressure spring 15 to become effective and turning the double lever in the position shown in FIG. 2. Via the lifting device 13 and the lifting plate 17, the lever arm 12 takes along the component 3 whose soldering joints had already been molten. In this way, the component 3 is removed from the circuit board 1 without any stresses being able to appear between the component 3 with its terminals 18 and the circuit board 1. After cooling down, the molten material of the retaining element 9 contained in the container 7 forms the cake 19 which is either thrown away or reused for forming a new retaining element.

Figure 3:
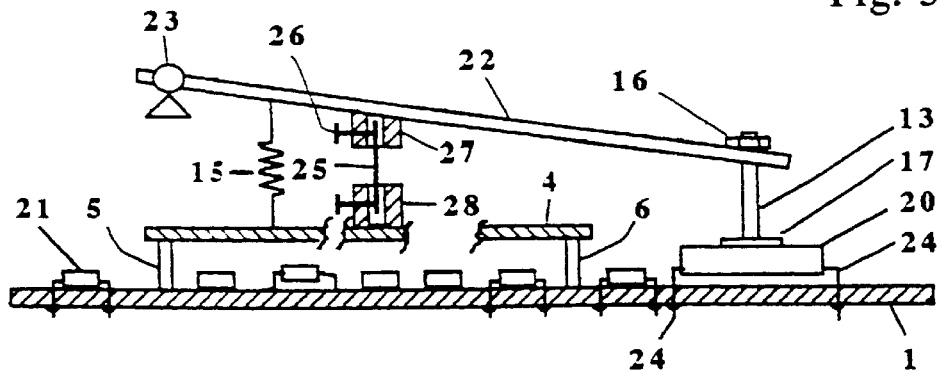
FIG. 3 shows a similar device with a single lever and a retaining element formed as a thread.

In contrast to the embodiment according to FIGS. 1 and 2, the variant disclosed in FIG. 3 shows the single lever 22 which is on one side supported by the swiveling axis 23. In principle, this support corresponds to that of the arrangement according to FIGS. 1 and 2. The end of the lever 22 facing away from the swiveling axis 23 is, like in the embodiment according to FIGS. 1 and 2, hinged to the lifting device 13 to which the component 20 is bonded via the lifting plate 17. Also in this case the component 20 is an integrated circuit which, however, is soldered to the circuit board by means of terminals 24 passed through the circuit board 1, namely on the side facing away from the component 20. This kind of connection between component and circuit board is also known. The further shown component 21 is also connected to the circuit board 1 by means of terminals passed through the circuit board 1.

The pressure spring 15 is acting on the lever 22, the force of said pressure spring being received by the thread or fiber 25 in the position shown in FIG. 3. Like in the embodiment according to FIGS. 1 and 2, this thread is again the retaining element consisting of a metal alloy, upon melting of which the force of the spring 15 can become effective since in this case the thread 25 disconnects the connection formed by it. One end of the thread 25 is connected to the retainer 27 by means of the screw 26 connected to the lever 22, said screw being shown in principle. The other end of the thread 25 is correspondingly connected to the retainer 28 connected to the frame 4.

When the arrangement according to FIG. 3 is heated in a similar way as described in connection with FIGS. 1 and 2, first the solder at the terminals 24 melts, thereby releasing the component 20. Then also the thread 25 melts and the compressive force of the pressure spring 15 can thus become effective and swivels the lever 22 about the axis 23. As is in principle apparent from FIG. 2, the component 20 is lifted from the circuit board 1. In connection with the arrangement according to FIG. 3, this position is not shown; however, in this connection reference is made to the statements made in connection with FIG. 2.

Figure 4:
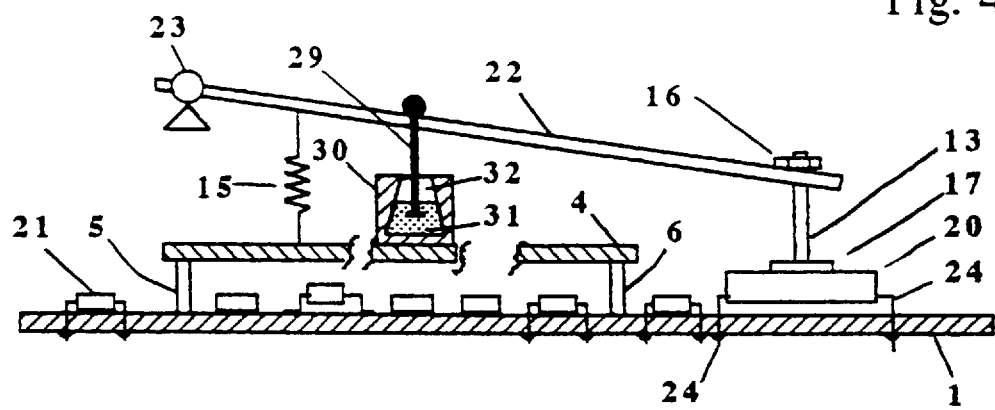
FIG. 4 shows a device with a single lever and a retaining element formed as a block.

FIG. 4 is a modification of the arrangement according to FIG. 3, i.e. with respect to the fact that the compressive force of the spring 15 is received by the tension rod 29 linked with the lever 22. The tension rod 29 is melted into the block 31 which, like in the above-mentioned embodiments, is made of a metal alloy similar to a solder. The container 30 comprises the opening 32 converging towards the outside, which prevents the solid block 31 from being pulled out of the container 30 thereby also holding in place the tension rod 29. Like the container 7 according to FIGS. 1 and 2, the container 30 is connected to the frame 4.

When the arrangement shown in FIG. 4 is heated, the same effect results as in the arrangement according to FIG. 3, i.e. the rod 29 is released by melting the block 31 so that the compressive force of the pressure spring 15 can have an effect on the lever and can thus lift the component 20, whose soldering joints had already been molten, from the circuit board 1.

Figure 5:
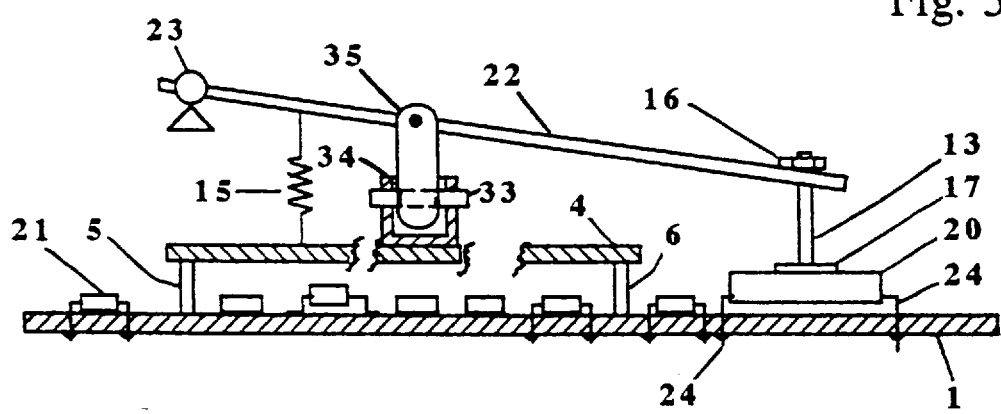
FIG. 5 shows a retaining element which is formed as a shearing pin.

A further modification of the arrangements according to FIGS. 3 and 4 is shown in FIG. 5 in which the retaining element is formed like a shearing pin 33. The shearing pin 33 passes through the walls of the holder 34 and a hole in the link 35 which is hinged to the lever 22 in a manner similar to that of the rod 29 according to FIG. 4. The shearing pin 33 being the retaining element again consists of the metal alloy described above, which also melts after the solder for connecting the components melts and thereby allows the link 35 to be pulled out of the retainer 34. Thus, the compressive force of the pressure spring 15 can become effective and can lift the component 20 from the circuit board as described in connection with FIGS. 3 and 4.

In the embodiment schematically shown in FIGS. 6a and b, the device comprises a lever 42 arranged on a swiveling axis 44, at the one (the right one in the drawing) end 42b of which the fusible material 48 is provided. The lifting device 43 is hinged between the swiveling axis 44 and the fusible material 48. If the temperature increase is high enough, the material 48 melts and flows into the basin 49. If a suitable counterweight of the left lever section 42a is selected, the lever 42 is swiveled according to FIG. 6b after the fixing material (e.g. solder) melts and the component 3 is lifted from the carrier 1.

Figure 7:
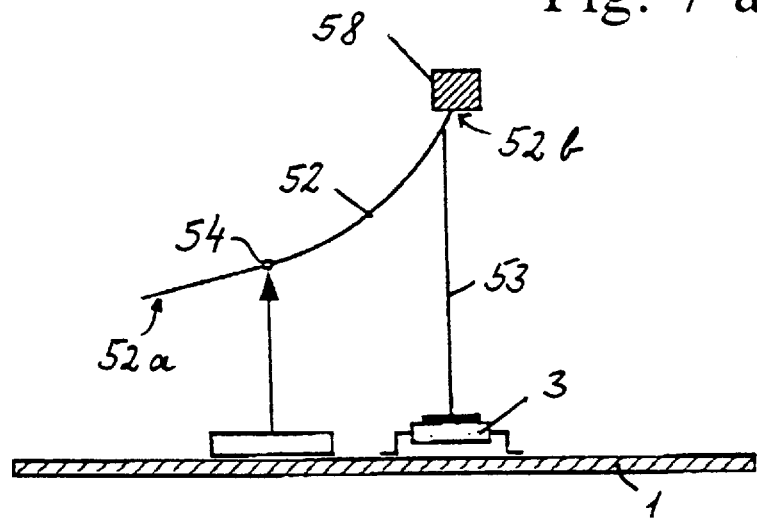
FIG. 7 shows a device with displaceable molten material.
Figure 7:
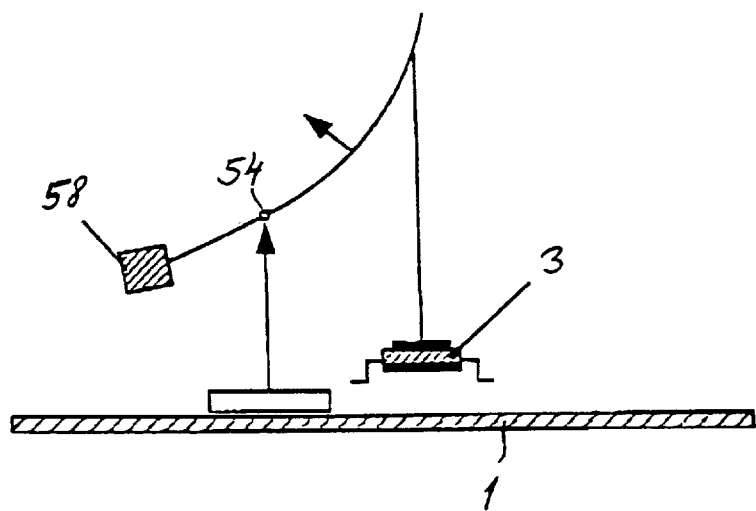

If the temperature increase is great enough, in an embodiment according to FIG. 7 the melting material 58 flows on an e.g. channel-like lever 52 (having a swiveling axis 54) from the higher end portion 52b to the lower end portion 52a. By means of this weight displacement the lever 52 exerts a vertical tensile force on the component via the lifting device 53, and when the fixing material of the component 3 is molten, said component is lifted from the support.

We claim:

1. Device for separating components (3, 20), in particular electronic components which are connected to a support, in particular a circuit board (1), by a fixing material and can be lifted from the support by means of a gripping element (17) under a preloaded force acting in the direction in which the components (3, 20) can be lifted from the support, wherein a lifting device (13) connected to the gripping element (17) causes the preloaded force to become effective when the fixing material reaches its melting temperature, characterized in that the lifting device (17) is provided with a retaining member (9, 25, 31, 33) made of a fusible material, whose melting temperature is equal to or higher than that of the fixing material and which triggers the action of lifting the component (3, 20) when the fusible material melts.

2. The device of claim 1, characterized in that said retaining member is formed as a supporting member (9) for the lifting device (13).

3. The device of claim 2, characterized in that said supporting member (9) is contained in an open container (7) from which the component made of the fusible material and formed by the melting process can be lifted.

4. The device of claim 1, characterized in that said retaining member is formed as a thread (25) clamped between said lifting device (22, 13) and a holding means (28).

5. The device of claim 1, characterized in that said retaining member is formed as a block (31) into which a tension rod (29) hinged to said lifting device (22) immerses.

6. The device of claim 1, characterized in that said retaining member is formed as a shearing pin (33).

7. The device of claim 1, characterized in that by means of local displacement after melting and by using the gravitational force said retaining member triggers a swiveling movement of the lever for lifting the component.

8. The use of claim 7, characterized in that the fusible material (49) of said retaining member flows off when melting.

9. The use of claim 7, characterized in that the fusible material (58) of said retaining member flows into a collecting basin (49) or along the lever (52).

10. The device of claim 1, characterized in that said lifting device is formed as a lever (11, 22), the preloaded force acting on said lever and the one end of said lever being connected with said gripper (17) which is spacedly hinged to said retaining member (9, 25, 31, 33).

11. The use of claim 1, characterized in that a material similar to a solder or a fusion adhesive is provided as the fusible material of said retaining member.

* * * * *